US012573442B2

(12) United States Patent    (10) Patent No.:    US 12,573,442 B2
Ross    (45) Date of Patent:       Mar. 10, 2026

(54) SELECTABLE MEMORY SYSTEM ERASE FUNCTION

(71) Applicant: Micron Technology, Inc., Boise, ID (US)

(72) Inventor: Frank F. Ross, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 18/501,873

(22) Filed: Nov. 3, 2023

(65) Prior Publication Data

US 2024/0177762 A1      May 30, 2024

Related U.S. Application Data

(60) Provisional application No. 63/428,670, filed on Nov. 29, 2022.

(51) Int. Cl.
G11C 11/406        (2006.01)
(52) U.S. Cl.
CPC .. G11C 11/40622 (2013.01); G11C 11/40615 (2013.01)
(58) Field of Classification Search
CPC ........................ G11C 11/40622; G11C 11/406

USPC ......................................................... 365/222
See application file for complete search history.

(56) References Cited

U.S. PATENT DOCUMENTS

2008/0151670 A1 *   6/2008   Kawakubo ............ G11C 11/406
                                                                  365/222
2018/0342282 A1 *  11/2018   Morgan  ............ G11C 11/40615

* cited by examiner

*Primary Examiner* — Muna A Techane
(74) *Attorney, Agent, or Firm* — Holland & Hart LLP

(57)                    ABSTRACT

Methods, systems, and devices for selectable memory system erase function are described. A user of a multitenancy memory system may request to vacate the memory system. A multitenancy controller may transmit an indication to erase data from a memory region associated with the user to a controller of the memory system. The controller may set bits of a mode register corresponding to the memory region to an erase value and other bits of the mode register corresponding to other memory regions to a normal value. The data may be erased from the memory region during the refresh cycle, while data from the other memory regions may be normally refreshed, according to the value of the bits in the mode register. The controller may indicate to the multitenancy controller that the data has been erased, and the multitenancy controller may enable the user to vacate from the memory system.

20 Claims, 7 Drawing Sheets

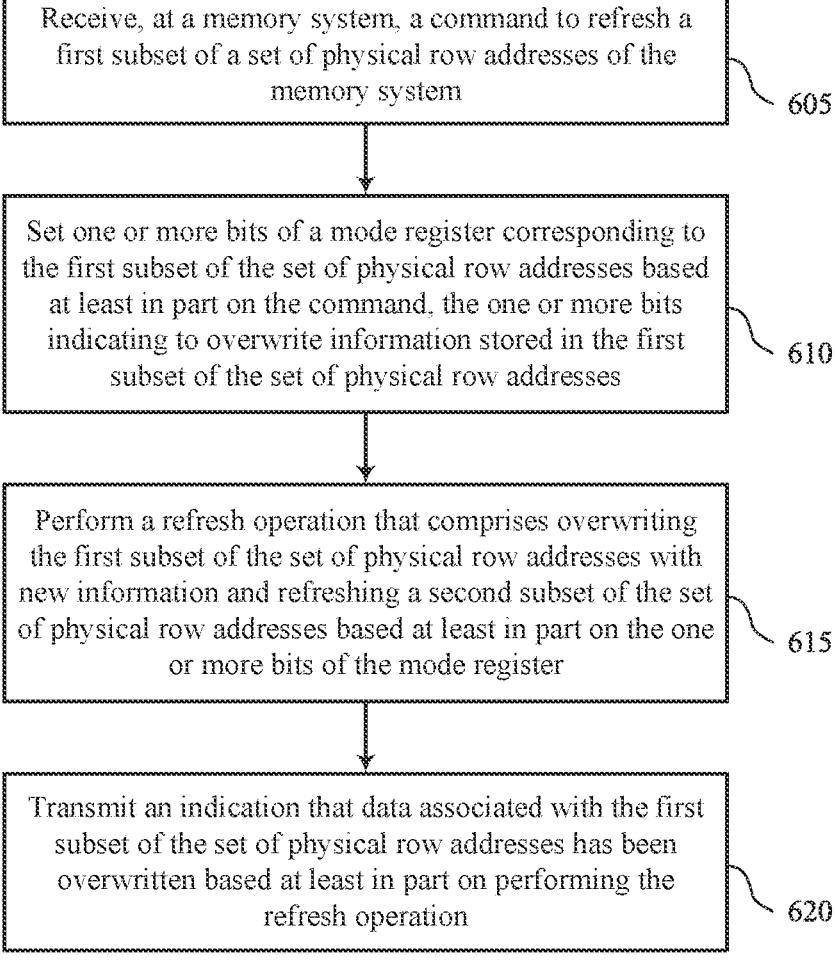

Receive, at a memory system, a command to refresh a first subset of a set of physical row addresses of the memory system

605

Set one or more bits of a mode register corresponding to the first subset of the set of physical row addresses based at least in part on the command, the one or more bits indicating to overwrite information stored in the first subset of the set of physical row addresses

610

Perform a refresh operation that comprises overwriting the first subset of the set of physical row addresses with new information and refreshing a second subset of the set of physical row addresses based at least in part on the one or more bits of the mode register

615

Transmit an indication that data associated with the first subset of the set of physical row addresses has been overwritten based at least in part on performing the refresh operation

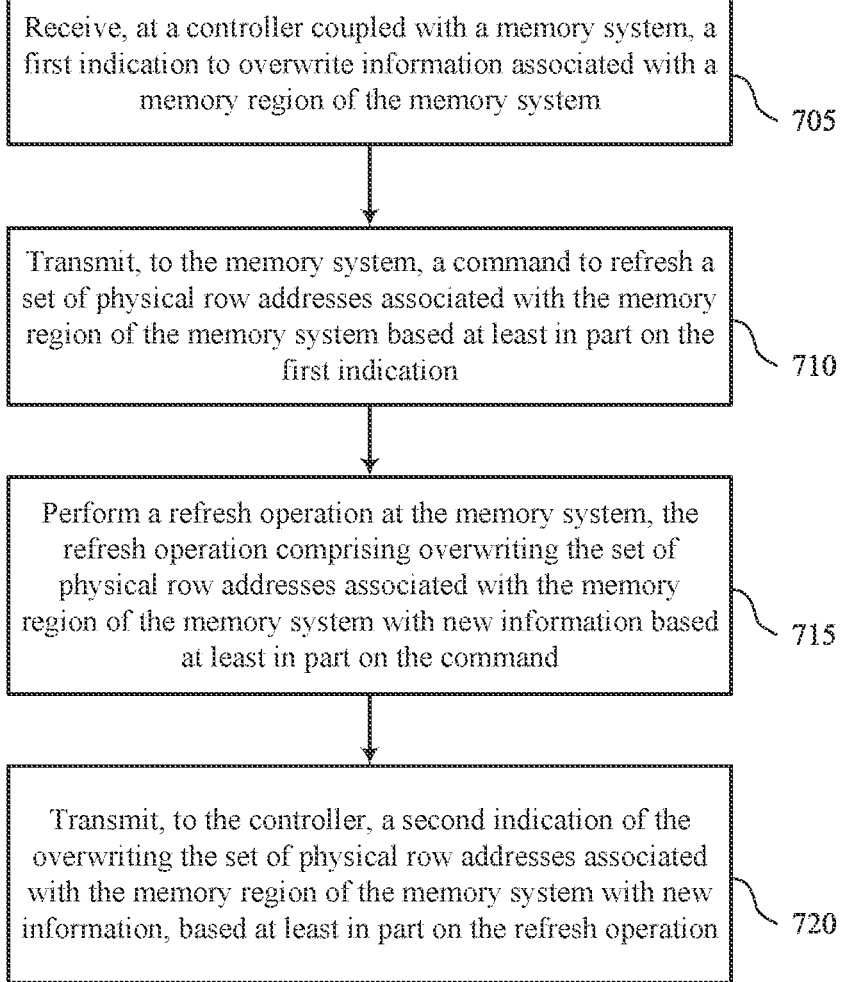

Receive, at a controller coupled with a memory system, a first indication to overwrite information associated with a memory region of the memory system

705

Transmit, to the memory system, a command to refresh a set of physical row addresses associated with the memory region of the memory system based at least in part on the first indication

710

Perform a refresh operation at the memory system, the refresh operation comprising overwriting the set of physical row addresses associated with the memory region of the memory system with new information based at least in part on the command

715

Transmit, to the controller, a second indication of the overwriting the set of physical row addresses associated with the memory region of the memory system with new information, based at least in part on the refresh operation

SELECTABLE MEMORY SYSTEM ERASE FUNCTION

CROSS REFERENCE

The present Application for Patent claims the benefit of U.S. Provisional Patent Application No. 63/428,670 by ROSS, entitled "SELECTABLE MEMORY SYSTEM ERASE FUNC," filed Nov. 29, 2022, assigned to the assignee hereof, and expressly incorporated by reference in its entirety herein.

FIELD OF TECHNOLOGY

The following relates to one or more systems for memory, including selectable memory system erase function.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 6 and 7 show flowcharts illustrating a method or methods that support selectable memory system erase function in accordance with examples as disclosed herein.

DETAILED DESCRIPTION

Figure 1:
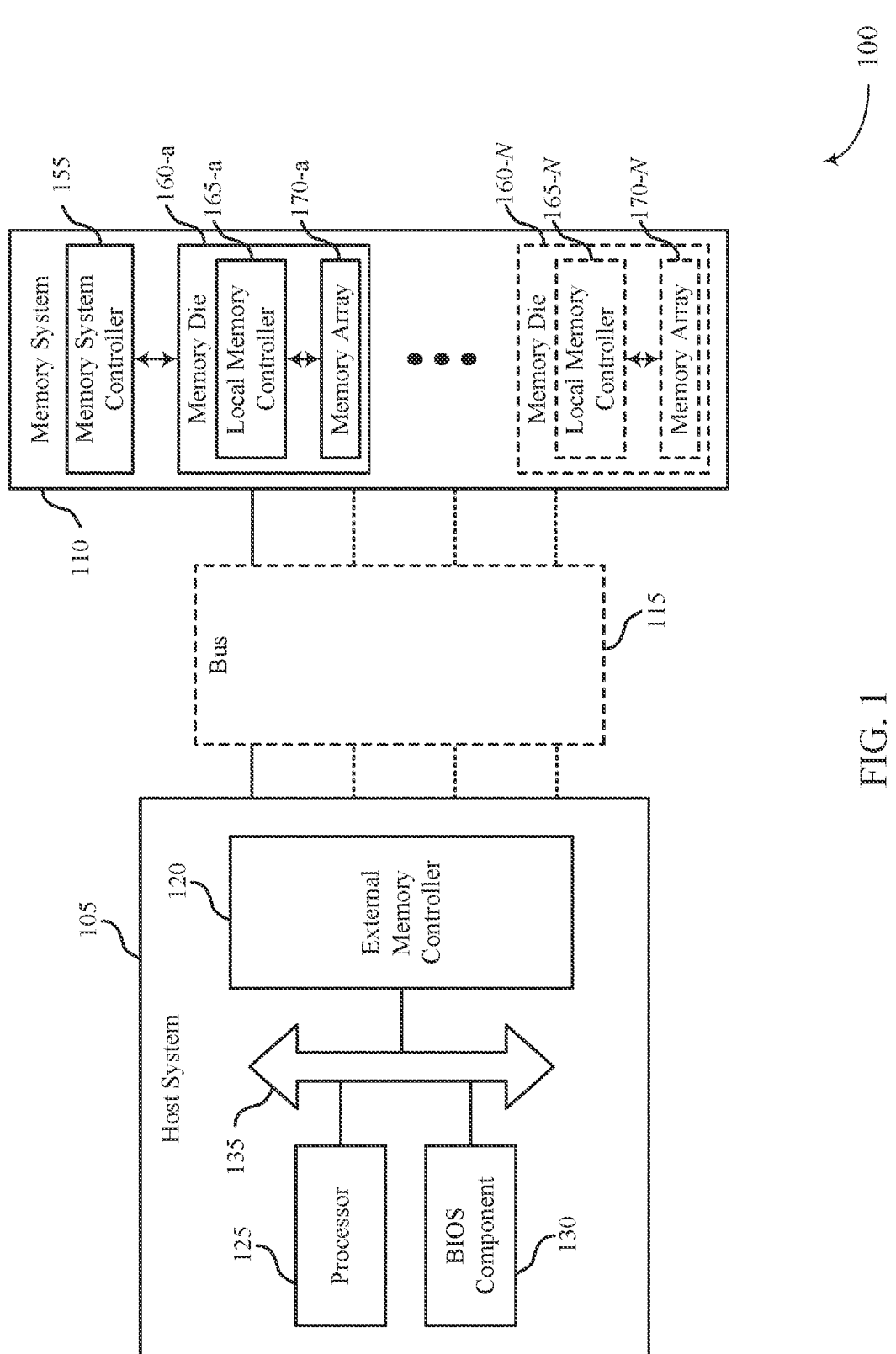
FIG. 1 illustrates an example of a system that supports selectable memory system erase function in accordance with examples as disclosed herein.

A memory system may have multitenancy capability, in which portions (e.g., addresses) of the memory system may be allocated for users of the memory system. For example, a user of the memory system may request to have physical row addresses of the memory system allocated for programming and storing user data In some cases, the user may no longer have a demand to store the user data in the memory system and may request to vacate (e.g., terminate use of) the memory system, such that the physical row addresses may no longer be allocated to the user. In such cases, the user may request the user data to be erased from the memory system. In some examples, the user data may be encrypted such that the user may have a cryptographic key (e.g., an encryption key) associated with accessing the user data. The memory system may erase (e.g., a secure erase operation associated with erasing cryptographic keys in NAND memory) the cryptographic key associated with accessing the user data, thereby preventing the user, or any other users, from accessing the user data, effectively nulling the user data. Such techniques, however, may leave user data on (whether encrypted or unencrypted) on the memory system until it is overwritten by new data In some cases, the user may demand that the user data be completely erased from the memory system (e.g., along with the cryptographic key) to ensure even greater data security. Some techniques may erase the user data from the memory system, such as by enabling a host system to overwrite the user data or by enabling a memory system controller to directly perform re-write operations (e.g., using a back-side memory interface between the memory system controller and a memory array). However, such techniques may reveal (e.g., to a bad actor) which physical row addresses were allocated to the user or adversely affect latency for other users of the memory system, thereby decreasing data security and performance, respectively.

In accordance with examples as described herein, a memory system may implement a selectable memory system erase function to overwrite user data (e.g., erase the user data, overwrite the user data with new data) from the memory system while maintaining high data security and performance. For example, a multitenancy controller may receive a request from a user to erase user data from the memory system and transmit an indication of the physical row addresses associated with the user data to a memory system controller. The memory system controller may map the physical row addresses to a corresponding memory device (e.g., DRAM device) of the memory system and transmit a mode register set command to the memory device. The mode register set command may adjust the bits stored in a mode register corresponding to the physical row addresses to indicate the memory device is to overwrite the user data from the physical row addresses during a refresh operation. In response to a refresh operation being performed on the indicated physical row addresses by the bits, the memory system may overwrite the user data in the physical row addresses as part of the refresh operation. Other physical rows (not indicated in the mode register) may be refreshed as usual by the refresh operation. For example, the refresh operation may read the value read from the memory cells and then re-write the value back into the memory cells. After completing the refresh command, the memory system controller may transmit another indication to the multitenancy controller indicating that the user data has been overwritten. The techniques described herein may provide greater data security for users of the memory system without increasing latency for other users of the memory system, among other advantages.

Features of the disclosure are initially described in the context of systems and dies as described with reference to FIGS. 1 and 2. Features of the disclosure are described in the context a system and process flow as described with reference to FIGS. 3 and 4. These and other features of the disclosure are further illustrated by and described with reference to an apparatus diagram and flowcharts that relate to selectable memory system erase function as described with reference to FIGS. 5 through 7.

FIG. 1 illustrates an example of a system 100 that supports selectable memory system erase function in accordance with examples as disclosed herein. The system 100 may include a host system 105, a memory system 110, and a bus 115 coupling the host system 105 with the memory system 110. The system 100 may include one or more memory systems 110, but aspects of the one or more memory systems 110 may be described in the context of a single memory system (e.g., memory system 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory system 110 may be a component of the system 100 that is operable to store data for one or more other components of the system 100.

Portions of the system 100 may be examples of the host system 105. The host system 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host system 105 may refer to the hardware, firmware, software, or any combination thereof that implements the functions of an external memory controller 120. In some examples, the external memory controller 120 may be referred to as a host (e.g., host system 105).

A memory system 110 may be an independent device or a component that is operable to provide physical memory addresses/space that may be used or referenced by the system 100. In some examples, a memory system 110 may be configurable to work with one or more different types of host devices. Signaling between the host system 105 and the memory system 110 may be operable to support one or more of: modulation schemes to modulate the signals, various pin configurations for communicating the signals, various form factors for physical packaging of the host system 105 and the memory system 110, clock signaling and synchronization between the host system 105 and the memory system 110, timing conventions, or other functions.

The memory system 110 may be operable to store data for the components of the host system 105. In some examples, the memory system 110 (e.g., operating as a secondary-type device to the host system 105, operating as a dependent-type device to the host system 105) may respond to and execute commands provided by the host system 105 through the external memory controller 120. Such commands may include one or more of a write command for a write operation, a read command for a read operation, a refresh command for a refresh operation, or other commands.

The host system 105 may include one or more of an external memory controller 120, a processor 125, a basic input/output system (BIOS) component 130, or other components such as one or more peripheral components or one or more input/output controllers. The components of the host system 105 may be coupled with one another using a bus 135.

The processor 125 may be operable to provide functionality (e.g., control functionality) for the system 100 or the host system 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105. The BIOS component 130 may include instructions (e.g., a program, software) stored in one or more of read-only memory (ROM), flash memory, or other non-volatile memory.

In some examples, the system 100 or the host system 105 may include an input component, an output component, or both. An input component may represent a device or signal external to the system 100 that provides information (e.g., signals, data) to the system 100 or its components. In some examples, and input component may include an interface (e.g., a user interface or an interface between other devices). In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory system 110 may include a memory system controller 155 and one or more memory dies 160 (e.g., memory chips) to support a capacity (e.g., a desired capacity, a specified capacity) for data storage. Each memory die 160 (e.g., memory die 160-a, memory die 160-N) may include a local memory controller 165 (e.g., local memory controller 165-a, local memory controller 165-N) and a memory array 170 (e.g., memory array 170-a, memory array 170-N). A memory array 170 may be a collection (e.g., one or more grids, one or more banks, one or more tiles, one or more sections) of memory cells, with each memory cell being operable to store one or more bits of data. A memory system 110 including two or more memory dies 160 may be referred to as a multi-die memory or a multi-die package or a multi-chip memory or a multi-chip package.

The memory system controller 155 may include components (e.g., circuitry, logic) operable to control operation of the memory system 110. The memory system controller 155 may include hardware, firmware, or instructions that enable the memory system 110 to perform various operations and may be operable to receive, transmit, or execute commands, data, or control information related to the components of the memory system 110. The memory system controller 155 may be operable to communicate with one or more of the external memory controller 120, the one or more memory dies 160, or the processor 125. In some examples, the memory system controller 155 may control operation of the memory system 110 described herein in conjunction with the local memory controller 165 of the memory die 160.

In some examples, the memory system 110 may communicate information (e.g., data, commands, or both) with the host system 105. For example, the memory system 110 may receive a write command indicating that the memory system 110 is to store data received from the host system 105, or receive a read command indicating that the memory system 110 is to provide data stored in a memory die 160 to the host system 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data, commands, or both) with the memory system controller 155. In some examples, a memory system 110 may not include a memory system controller 155, and a local memory controller 165 or the external memory controller 120 may perform various functions described herein. As such, a local memory controller 165 may be operable to communicate with the memory system controller 155, with other local memory controllers 165, or directly with the external memory controller 120, or the processor 125, or any combination thereof. Examples of components that may be included in the memory system controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the memory system controller 155 or local memory controller 165 or both.

The external memory controller 120 may be operable to enable communication of information (e.g., data, commands, or both) between components of the system 100 (e.g., between components of the host system 105, such as the processor 125, and the memory system 110). The external memory controller 120 may process (e.g., convert, translate) communications exchanged between the components of the host system 105 and the memory system 110. In some examples, the external memory controller 120, or other component of the system 100 or the host system 105, or its functions described herein, may be implemented by the processor 125. For example, the external memory controller 120 may be hardware, firmware, or software, or some combination thereof implemented by the processor 125 or other component of the system 100 or the host system 105. Although the external memory controller 120 is depicted as being external to the memory system 110, in some examples, the external memory controller 120, or its functions described herein, may be implemented by one or more components of a memory system 110 (e.g., a memory system controller 155, a local memory controller 165) or vice versa.

The components of the host system 105 may exchange information with the memory system 110 using one or more directional differential signals of the bus 115. The bus 115 may be operable to support communications between the external memory controller 120 and the memory system 110. Each bus 115 may be an example of a transmission medium that carries information between the host system 105 and the memory system 110. Each bus 115 may include one or more signal paths (e.g., a transmission medium, a conductor) between terminals associated with the components of the system 100. A signal path may be an example of a conductive path operable to carry a signal. For example, a bus 115 may be associated with a first terminal (e.g., including one or more pins, including one or more pads) at the host system 105 and a second terminal at the memory system 110. A terminal may be an example of a conductive input or output point of a device of the system 100, and a terminal may be operable to act as part of a bus.

The bus 115 (and associated signal paths and terminals) may be dedicated to communicating one or more types of information. For example, signaling may be communicated over the bus 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the bus 115 may be operable to communicate commands, addresses, data, other information, or any combination thereof between the host system 105 and the memory system 110. For example, commands carried by the bus 115 may include a read command with an address of the desired data. In some examples, the bus 115 may include any quantity of signal paths (e.g., eight or nine signal paths) to communicate control information (e.g., commands or addresses). In some cases, the bus 115 may communicate information between the host system 105 and the memory system 110 via packets.

In some examples, the bus 115 may be operable to communicate one or more clock signals between the host system 105 and the memory system 110. Clock signals may be operable to oscillate between a high state and a low state, and may support coordination (e.g., in time) between actions of the host system 105 and the memory system 110. In some examples, the clock signal may be single ended. In some examples, the clock signal may provide a timing reference for command and addressing operations for the memory system 110, or other system-wide operations for the memory system 110. A clock signal may be referred to as a control clock signal, a command clock signal, or a system clock signal. A system clock signal may be generated by a system clock, which may include one or more hardware components (e.g., oscillators, crystals, logic gates, transistors).

In accordance with examples as described herein, the memory system 110 may implement a selectable erase function to overwrite user data from the memory system 110 as part of a refresh operation while maintaining high data security and performance. For example, a multitenancy controller may receive a command to overwrite user data (e.g., erase the user data, overwrite the user data with new data) from the memory system 110 and transmit an indication of the physical row addresses associated with the user data to the memory system controller 155. The memory system controller 155 may map the physical row addresses to a corresponding memory die 160 (e.g., memory die 160-a, 160-N) and transmit a mode register set command to the memory die 160. The mode register set command may set bits of a mode register corresponding to the physical row addresses to indicate the memory die 160 to overwrite the user data from the physical row addresses as part of a refresh operation. The refresh operation may overwrite the user data in the physical row addresses corresponding to the bits, and refresh the rest of the physical row addresses in the memory die 160 as usual (e.g., as during a normal refresh cycle). After completing the refresh command, the memory system controller 155 may transmit another indication to the multitenancy controller indicating that the user data has been overwritten. The techniques described herein may provide greater data security for users of the memory system 110 without increasing latency for other users of the memory system 110, among other advantages.

Figure 2:
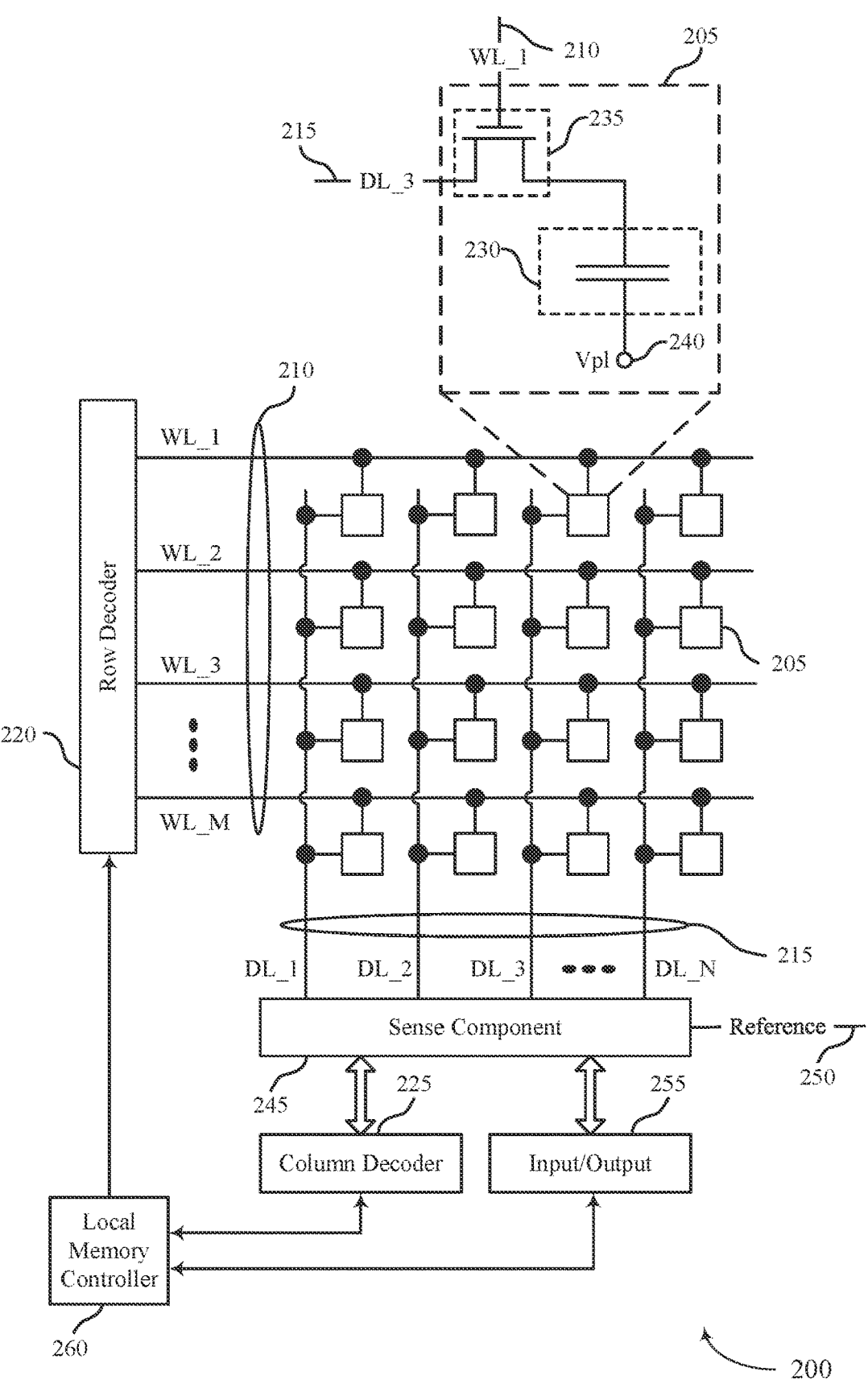
FIG. 2 illustrates an example of a memory die that supports selectable memory system erase function in accordance with examples as disclosed herein.

FIG. 2 illustrates an example of a memory die 200 that supports selectable memory system erase function in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory system 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host system 105, another controller associated with the memory die 200), translate the commands or the data (or both) into information that can be used by the memory die 200, perform one or more operations on the memory die 200, and communicate data from the memory die 200 to a host (e.g., a host system 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host system 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In accordance with examples as described herein, a memory system (e.g., which may be an example of a memory system 110, as described with reference to FIG. 1) may implement a selectable erase function to overwrite user data (e.g., erase the user data, overwrite the user data with new data) from the memory system as part of a refresh operation while maintaining high data security and performance. For example, a multitenancy controller may receive a request to overwrite user data from the memory system and transmit an indication of the physical row addresses associated with the user data to a memory system controller. The memory system controller may map the physical row addresses to a corresponding memory die 200 (e.g., which may be an example of a memory die 160, as described with reference to FIG. 1) of the memory system and transmit a mode register set command to the memory die 200. The mode register set command may set bits of a mode register corresponding to the physical row addresses to indicate the memory die 200 to overwrite the user data from the physical row addresses as part of a refresh operation. The refresh operation may overwrite the user data in the physical row addresses corresponding to the bits, and refresh the rest of the physical row addresses in the memory die 160 as usual (e.g., as during a normal refresh cycle). After completing the refresh command, the memory system controller (e.g., which may be an example of a device system controller 155, as described with reference to FIG. 1) may transmit another indication to the multitenancy controller indicating that the user data has been overwritten. The techniques described herein may provide greater data security for users of the memory system without increasing latency for other users of the memory system, among other advantages.

Figure 3:
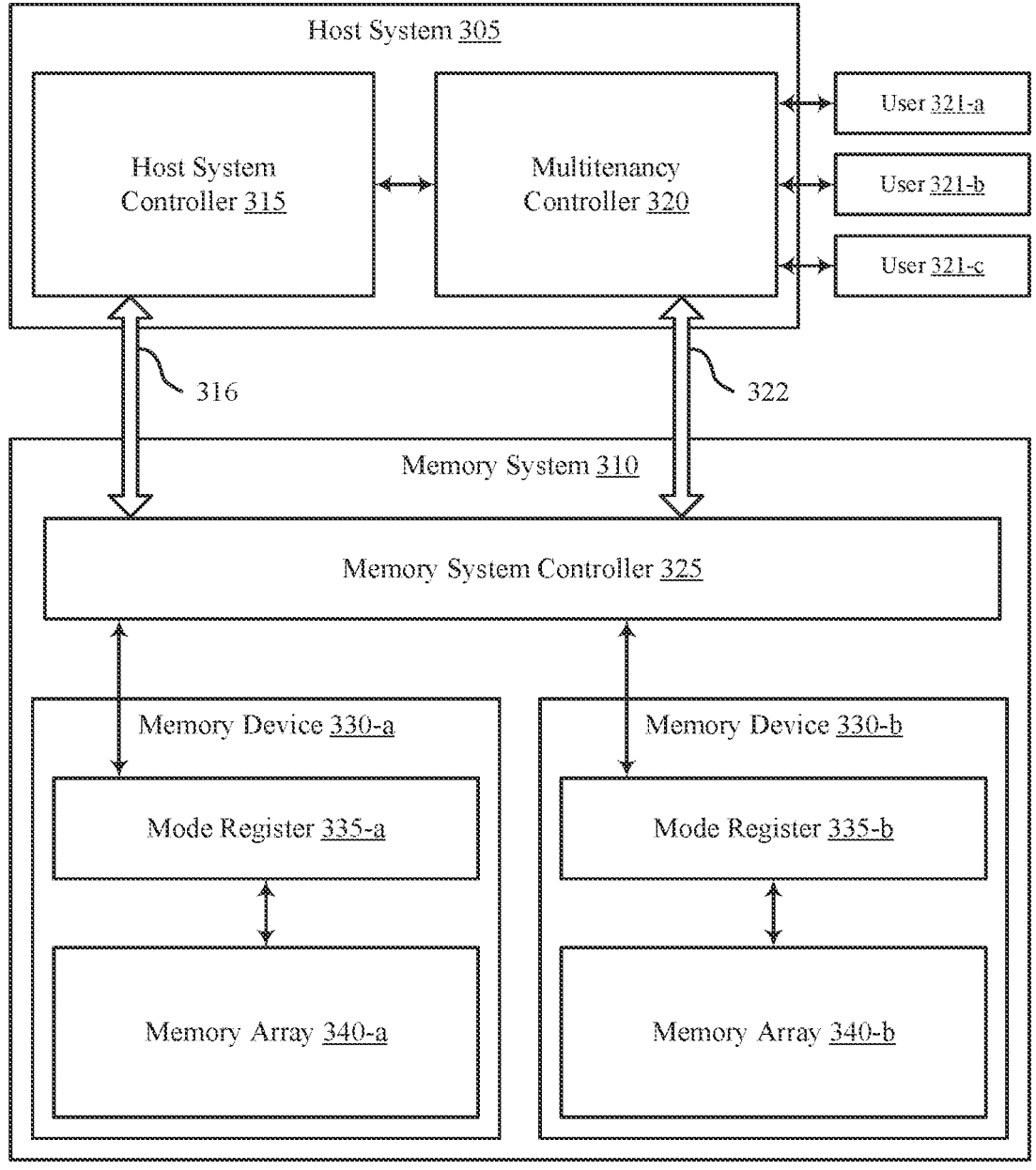
FIG. 3 illustrates an example of a system that supports selectable memory system erase function in accordance with examples as disclosed herein.

FIG. 3 illustrates an example of a system 300 that supports selectable memory system erase function in accordance with examples as disclosed herein. The system 300 may be an example of and implement aspects of a system 100, as described with reference to FIG. 1. For example, the system 300 may include a host system 305 and a memory system 310, which may be examples of a host system 105 and a memory system 110, as described with reference to FIG. 1. In some cases of multitenancy, the host system 305 may indicate the memory system 310 to overwrite user data from the memory system 310, and the memory system 310 may overwrite the user data during a normal refresh cycle according to mode register bits associated with the user data. Erasing the user data during a normal refresh cycle may support increased data security while preventing increased latency otherwise associated with erasing the user data.

The system 300 may include the host system 305 and the memory system 310, where the memory system 310 may support multitenancy. In some cases, the host system 305 and the memory system 310 may support a DRAM memory architecture or another memory architecture (e.g., NAND memory, FeRAM memory, SRAM memory). For example, the memory system 310 may include memory cells which may be configured as NAND memory cells. In a multi-tenant memory system, users 321 (e.g., virtual machines, cores, tenants) may each be allotted a subset of physical row addresses of the memory system 310 for storing user data. The host system 305 may include a host system controller 315 which may be an example of external memory controller 120, as described with reference to FIG. 1. The host system controller 315 may facilitate operation of the host system 305 and facilitate communication between the host system 305 and the memory system 310 via a communication channel 316 (e.g., a main bus, a main interface). In some cases, the host system controller 315 may perform operations (e.g., access operations) on the memory system 310 in accordance with commands transmitted from the host system controller 315. The host system 305 may also include a multitenancy controller 320 (e.g., a fabric manager, a hypervisor) which may manage the users 321 (e.g., users 321-*a*. 321-*b*, 321-*c*) of the memory system 310. For example, the multitenancy controller 320 may receive requests from a user 321-*a* to allocate a quantity of physical row addresses of the memory system 310 to the user 321-*a*, and allocate a subset of physical row addresses of the memory system 310 according to the quantity of physical row addresses requested. Additionally, the multitenancy controller 320 may receive requests from the user 321-*a* to vacate (e.g., leave) the memory system 310, such that the subset of physical row addresses may no longer be allocated to the user 321-*a*. Each user 321 that accesses the memory system 310 may be an example of an individual host system that sends access commands to its portion of the memory system 310.

The memory system 310 may include a memory system controller 325 (e.g., a compute express link (CXL) memory controller), which may be an example of memory system controller 155, as described with reference to FIG. 1. The memory system controller 325 may be configured to communicate with the host system controller 315 to receive commands and perform corresponding operations on the memory system 310. Additionally, the memory system controller 325 may be configured to communicate with the multitenancy controller 320 via a second communication channel 322 (e.g., a side-link bus, a side-link interface). The memory system 310 may include one or more memory devices 330 (e.g., memory device 330-*a*, 330-*b*), which may be examples of memory dies 160, as described with reference to FIG. 1. The memory devices 330 may be DRAM memory dies, where each memory device 330 may include a mode register 335 (e.g., mode register 335-*a*, 335-*b*) and a memory array 340 (e.g., memory array 340-*a*, 340-*b*). Each mode register 355 may be configured to store bits corresponding to physical row addresses of each memory array 340. For example, mode register 335-*a* may be configured to store a quantity of bits corresponding to a quantity of physical row addresses of memory array 340-*a*, where each bit may correspond to a physical row address.

The memory arrays 340 of the memory system 310 may be periodically or aperiodically refreshed by performing refresh cycles (e.g., normal refresh cycles), such that data in the memory arrays 340 may be refreshed in cycles. In some cases, the host system controller 315 may transmit a refresh command to the memory system controller 325, indicating the memory system controller 325 to begin or refrain from performing refresh cycles on the memory arrays 340. Each refresh cycle may correspond to a duration (e.g., 32 μs) to sequentially refresh each physical row address of the memory array 340 (e.g., beginning with a first physical row address), such that upon exceeding the duration, data in each physical row address of the memory array 340 may be refreshed. In some cases, each mode register 335 may indicate to refresh the physical row addresses of the corresponding memory array 340 based on the value of the bits of each mode register 335. For example, bit(s) of the mode register 335-*a* may indicate whether to refresh the data in a corresponding physical row address of the memory array 340-*a* during the refresh cycle.

In some cases, when the memory system 310 is supporting another memory architecture (e.g., besides DRAM memory), the memory arrays 340 may not be refreshed. For example, the memory system 310 may not initiate refreshing the memory arrays 340 as a result of a refresh command. In such cases, the memory system 310 may implement another operation, such as a maintenance operation to enable the memory arrays 340 to retain data. For example, the memory system 310 may regularly or periodically perform a maintenance operation as a result of a maintenance command to enable data retention. Further, in such cases, the memory system 310 may be configured to support the selectable memory system erase function as described herein when the memory system 310 is configured to support another memory architecture.

In some cases, a user 321-*a* may transmit a request to the multitenancy controller 320 to allocate a quantity of physical row addresses of the memory system 310 for storing user data associated with the user 321-*a*. The multitenancy controller 320 may maintain a listing of physical row addresses (e.g., logical row addresses, host physical row addresses) allocated to users 321 of the memory system 310, and may determine the quantity of physical row addresses are available (e.g., not currently allocated to other users 321) in the memory system 310. The multitenancy controller 320 may allocate a subset of physical row addresses (e.g., corresponding to the quantity of physical row addresses) in the memory system 310 to the user 321-*a*, where the user 321-*a* may program (e.g., directly or in-directly) the subset of physical row addresses with user data. In some examples, the user 321-*a* may program the user data to the subset of physical row addresses and the data may be encrypted with a cryptographic key assigned to the user 321-*a*.

In some cases, the user 321-*a* may transmit a request to the multitenancy controller 320 to vacate the memory system 310. In some examples, the user 321-*a* may indicate the multitenancy controller 320 to erase the cryptographic key (e.g., disabling accessing the user) associated with the user 321-*a*, to overwrite the user data, or a combination thereof. In some implementations, the multitenancy controller 320 may be configured to determine whether to erase the cryptographic key (e.g., disabling accessing the user) associated with the user 321-*a*, to overwrite the user data, or a combination thereof based on the identity of the user 321-*a*. In cases where it is determined to erase the cryptographic key, the multitenancy controller 320 may erase the cryptographic key or may transmit an indication to the memory system controller 325 to erase the cryptographic key associated with the subset of physical row addresses allocated to the user 321-*a*. In cases where it is determined to overwrite the user data, the multitenancy controller 320 may transmit an indication to the memory system controller 325 to overwrite the user data in the subset of physical row addresses. The multitenancy controller 320 may specify the subset of physical row addresses as logical row addresses (e.g., or host physical addresses) in the indication, such that the indication may include a subset of logical row addresses.

The memory system controller 325 may receive the indication to overwrite the user data from the subset of physical row addresses. The memory system controller 325 may map the logical row addresses to physical row addresses (e.g., back-side deice physical addresses) of the memory system 310, thereby identifying a subset of physical row addresses corresponding to the subset of logical row addresses. For example, the memory system controller 325 may map the subset of logical row addresses to the subset of physical row addresses and determine the subset of physical row addresses is of the memory array 340-*a* of the memory device 330-*a*. A mode register set command may be received by the mode register 335-*a*, indicating the mode register 335-*a* to set each bit of a subset of bits corresponding to the subset of physical row addresses to an erase value. In some cases, the mode register set command may be transmitted by the memory system controller 325, the multitenancy controller 320, the host system controller 315, or any combination thereof.

In some cases, the mode register 335-*a* may set each bit of the subset of bits corresponding to the subset of physical row addresses to an erase value based on receiving the mode register set command. In some examples, setting the subset of bits to an erase value may indicate to overwrite (e.g., erase or overwrite) the user data in the subset of physical row addresses during a next refresh cycle. In such examples, when the next refresh cycle is performed after the subset of bits are set to the erase value, the user data in the subset of physical row addresses corresponding to the subset of bits may be overwritten. In some implementations, erasing the user data may include overwriting each data bit of the user data with a fixed value (e.g., 0, 1, 00, 01, 10, 11), inversing each data bit of the user data (e.g., 0 may be inversed to 1, and vice versa), or randomizing each data bit of the user data (e.g., writing each data bit to a random value).

In some cases, setting the subset of bits to the erase value may include setting each bit of the subset of bits to the erase value. In other cases, setting the subset of bits to the erase value may include setting a first bit of the subset of bits corresponding to a first physical row address of the subset of physical row addresses to a start erase value and setting a last bit of the subset of bits corresponding to a last physical row address of the subset of physical row addresses to a stop erase value. The start erase value may indicate to initialize erasing the user data from the physical row addresses during the refresh cycle, such that the user data from the first physical row address and each subsequent physical row address may be overwritten. The stop erase value may indicate to stop erasing the user data from the physical row addresses during the refresh cycle, such that the user data from physical row addresses subsequent to the last physical row address may not be overwritten. In other cases, setting the subset of bits to the erase value may include setting the first bit to the start erase value and setting a counter value of a counter, where the counter may be part of the mode register 335-a. The counter value may indicate a quantity of physical row addresses (e.g., corresponding to the subset of physical row addresses) to overwrite during the refresh cycle, such that the user data from the first physical row address and each subsequent physical row address will be overwritten until the counter value is satisfied, at which time the physical row addresses subsequent to the physical row address associated with satisfying the counter value will not be overwritten. In other cases, setting the subset of bits to the erase value may be based on the subset of bits being associated with one or more fixed regions of the memory system.

In some cases, the mode register 335-a may set each bit of a second subset of bits (e.g., the other bits of the mode register, the bits of the mode register excluding the subset of bits) corresponding to a second subset of physical row addresses (e.g., the other physical row addresses, the physical row addresses excluding the subset of physical row addresses) to a normal value based on receiving the mode register set command from the memory system controller 325. In some examples, the mode register set command may indicate the mode register 335-a to set each bit of the second subset of bits to the normal value. In some cases, setting the second subset of bits to a normal value may indicate to refresh data in the second subset of physical row addresses during the next refresh cycle. In such examples, when the next refresh cycle is performed after the second subset of bits are set to the normal value, the data in the second subset of physical row addresses corresponding to the second subset of bits may be refreshed normally (e.g., sensed and amplified). In some cases, the mode register 335-a may clear the bits of the mode register 335-a after completing a refresh cycle. In some examples, the mode register 335-a may overwrite the bits of the mode register 335-a to the normal value after completing a refresh cycle, without receiving a mode register set command from the memory system controller 325. In some examples, an indication that the mode register has been erased may be transmitted based on overwriting each bit of the mode register. In some implementations, when the next refresh cycle is performed on the memory device 330-a after the mode register 335-a is cleared, the data in each physical row address of the memory device 330-a may be refreshed based on the normal value previously overwritten to each bit of the mode register 335-a.

In some cases, the memory system controller 325 may determine whether the user data has been overwritten from the memory array 340-a. In some cases, the memory system controller 325 may poll the mode register 335-a to determine if the refresh cycle has been completed or if the refresh cycle has sequentially exceeded the last physical row address of the subset of physical row addresses associated with storing the user data. In some examples, the memory system controller 325 may determine that the user data has been overwritten based on polling the mode register 335-a and identifying that the mode register 335-a has been cleared. In other examples, the memory system controller 325 may determine that the user data has not been overwritten based on polling the mode register 335-a and determining that the mode register 335-a has not been cleared and the refresh cycle has not sequentially exceeded the last physical row addresses of the subset of physical row addresses. In other cases, the memory system controller 325 may determine the user data has been overwritten from the memory array 340-a by waiting for the duration associated with performing the refresh cycle to be exceeded (e.g., more than 32 μs). The memory system controller 325 may determine that data has been erase (e.g., overwritten) after the duration has elapsed. In some cases, different thresholds may be used to determine a timeout condition for determining whether data has been erased.

In some cases, the memory system controller 325 may transmit an indication to the multitenancy controller 320 that the user data has been overwritten, based on determining the user data has been overwritten. For example, the memory system controller 325 may poll the mode register 335-a to determine the user data has been overwritten and then transmit the indication, or may wait for the duration of the refresh cycle to be satisfied and then transmit the indication. After receiving the indication from the memory system controller 325, the multitenancy controller 320 may transmit a response to the user 321-a indicating that the user 321-a may vacate the memory system 310. In some examples, the response may inform the user 321-a that the user data has been overwritten. In accordance with examples as described herein, erasing the user data during a normal refresh cycle may support increased data security while preventing increased latency otherwise associated with erasing the user data.

Figure 4:
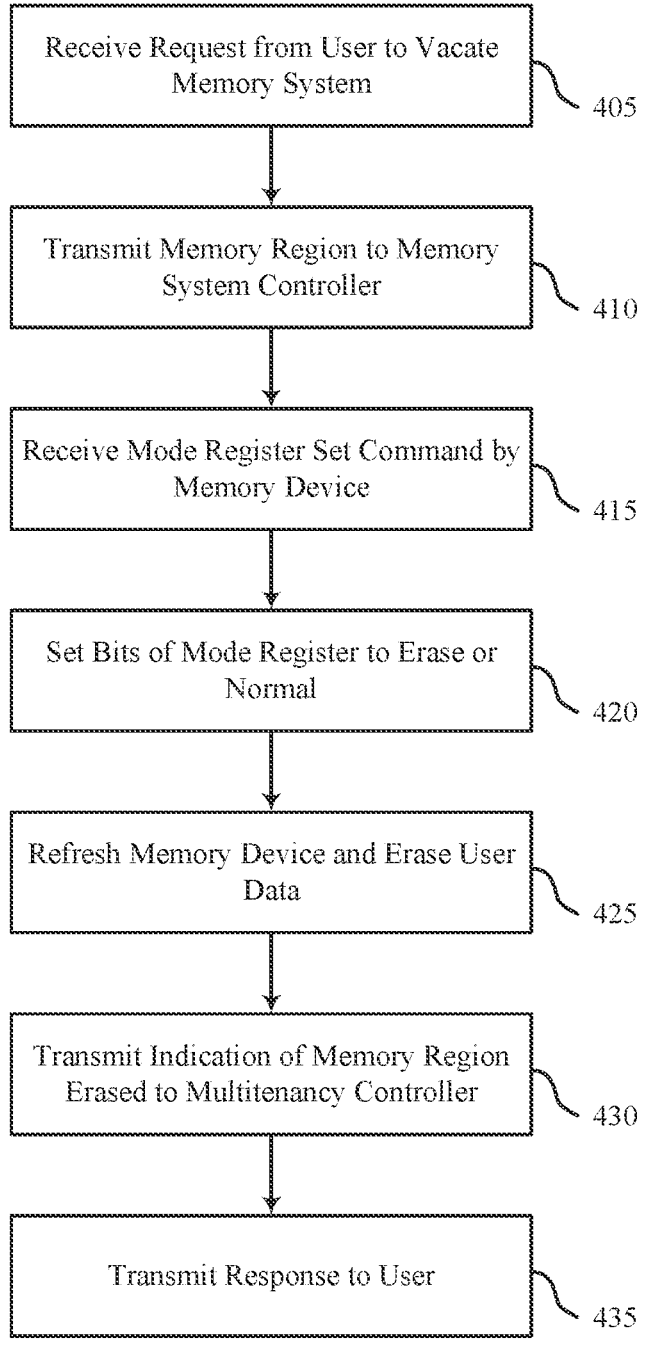
FIG. 4 illustrates an example of a process flow that supports selectable memory system erase function in accordance with examples as disclosed herein.

FIG. 4 illustrates an example of a process flow 400 that supports selectable memory system erase function in accordance with examples as disclosed herein. The process flow 400 may illustrate aspects or operations of systems 100, memory dies 200, or systems 300, as described with reference to FIGS. 1 through 3, respectively. For example, the process flow 400 may depict operations at a memory system or a host system, which may be examples of a memory system 110 or a memory system 310 and a host system 105 or a host system 305, respectively, as described with reference to FIGS. 1 and 3, respectively. In the following description of the process flow 400, the methods, techniques, processes, and operations may be performed in different orders or at different times. Further, certain operations may be left out of the process flow 400, or other operations may be added to the process flow 400. The operations described herein may support erasing user data during a normal refresh cycle, thereby enabling increased data security while preventing increased latency otherwise associated with erasing the user data.

Aspects of the process flow 400 may be implemented by a controller (e.g., a host system controller, a memory system controller, a multitenancy controller) which may be an example of host system controller 315, memory system controller 325, or multitenancy controller 320 as described with reference to FIG. 3. Additionally, or alternatively, aspects of the process flow 400 may be implemented as instructions stored in memory (e.g., firmware stored in a memory coupled with a memory system or a host system). For example, the instructions, when executed by a controller (e.g., the host system controller, the memory system controller, the multitenancy controller), may cause the controller to perform the operations of the process flow 400.

At 405, a multitenancy controller of the host system may receive a request from a user to vacate the memory system. In some cases, the user may request user data associated with the user to be overwritten. In other cases, the user may request a cryptographic key associated with accessing the user data to be overwritten. In such cases, the multitenancy controller may erase the cryptographic key or instruct the memory system controller to erase the cryptographic key, and the process flow 400 may proceed to step 435.

At 410, the multitenancy controller may transmit an indication of a memory region to a memory system controller of the memory system. The memory region may be a set of logical row addresses associated with the storing the user data. In some cases, the multitenancy controller may store a list of memory regions allocated to users of the memory system and transmitting the indication of the memory region may be based on identifying the memory region associated with the user from the list of memory regions. In some cases, the memory system controller may map the set of logical row addresses to a set of physical row addresses of the memory system based on receiving the indication. For example, the memory system controller may store a mapping of logical row addresses (e.g., host physical addresses) to physical row addresses and identify the set of physical row addresses is in a memory device (e.g., a DRAM memory die) of the memory system. In some examples, the indication may indicate the memory system controller to overwrite the memory region.

At 415, a mode register set command may be received by the memory device associated with the set of physical row addresses corresponding to the memory region. The mode register set command may be transmitted by the memory system controller, the host system controller, the multitenancy controller, or a combination thereof. The mode register set command may be received by a mode register of the memory device, where the mode register may include bits corresponding to physical row addresses of a memory array of the memory device. In some cases, the mode register set command may indicate the mode register to set each bit in a set of bits corresponding to the set of physical row addresses to an erase value. In some examples, the mode register set command may indicate the mode register to set each bit in a second set of bits corresponding to a second set of physical row addresses to a normal value, where the second set of physical row addresses correspond to the memory regions of the memory device excluding the memory region (e.g., the rest of the physical row addresses in the memory device excluding the set of physical row addresses).

At 420, the mode register may set the bits of the mode register to values according to the mode register set command. For example, the mode register may set each bit of the set of bits to an erase value and each bit of the second set of bits to a normal value. In some implementations, setting the set of bits may include setting a first bit of the set of bits (e.g., corresponding to a first physical row address of the set of physical row addresses) to a start erase bit, setting a last bit of the set of bits (e.g., corresponding to a last physical row address of the set of physical row addresses) to a stop erase bit, or setting a counter to a counter value (e.g., associated with the quantity of physical row addresses of the set of physical row addresses), or a combination thereof. In other implementations, the set of bits may be set based on the set of bits being associated with one or more fixed regions of the memory system.

At 425, the memory device may be refreshed, such that a refresh cycle (e.g., a normal refresh cycle) may be performed on the physical row addresses of the memory device. In some cases, the refresh cycle may be initiated by a refresh command from the host system (e.g., a host system controller). In some cases, the refresh cycle may be one of a plurality of refresh cycles contiguously performed, where each refresh cycle may be associated with a time interval (e.g., 32 µs) to sequentially refresh data in each physical row address of the memory device. The bits of the mode register may indicate the refresh cycle to be performed in accordance with the value of each bit, such that an erase value at a bit may cause the refresh cycle to overwrite (e.g., erase or overwrite) data in the physical row address corresponding to the bit, or a normal value at a bit may cause the refresh cycle to refresh (e.g., normally refresh by sensing and amplify) data in the physical row address corresponding to the bit. For example, the user data in the set of physical row addresses may be overwritten based on each bit in the set of bits having an erase value, and data in the second set of physical row addresses may be refreshed based on each bit in the second set of bits having a normal value. In some implementations, erasing the user data may include overwriting each data bit of the user data with a fixed value (e.g., 0, 1, 00, 01, 10, 11), inversing each data bit of the user data (e.g., 0 may be inversed to 1, and vice versa), or randomizing each data bit of the user data (e.g., writing each data bit to a random value). In some implementations, after performing the refresh cycle, the mode register may be cleared, such that each bit of the mode register may be overwritten with the normal value, without receiving a command (e.g., a mode register set command) from the memory system controller. In some cases, an indication that the mode register has been cleared may be transmitted based on overwriting the bits of the mode register. For example, when the next refresh cycle is performed on the memory device after the mode register is cleared, the data in each physical row address of the memory device may be refreshed based on the normal value previously overwritten to each bit of the mode register.

At 430, the memory system controller may transmit an indication that the memory region has been overwritten to the multitenancy controller. For example, the memory system controller may indicate that the user data associated with the memory region has been overwritten. In some cases, transmitting the indication may be based on determining the memory region has been overwritten. In some examples, the memory system controller may determine the memory region has been overwritten by polling the mode register, such that a cleared mode register may indicate the memory region has been overwritten (e.g., due to the mode register being cleared after completing the refresh operation). In some implementations, the memory system controller may determine the memory region has been overwritten by polling the mode register to determine if the last bit of the subset of bits has been succeeded in the refresh cycle. In other examples, the memory system controller may determine the memory region has been overwritten by waiting a duration exceeding the time interval associated with performing the refresh cycle (e.g., more than 32 µs).

At 435, the multitenancy controller may transmit a response to the user indicating that the user data has been overwritten. For example, the multitenancy controller may transmit the response to the user data based on receiving the indication from the memory system controller that the memory region has been overwritten. In some implementations, the response may indicate that the cryptographic key has been overwritten. In some cases, the response may indicate that the user may vacate the memory system. Upon receiving the response, the user may vacate the memory system.

In accordance with examples as described herein, erasing user data during the normal refresh cycles may allow the memory system to offer greater data securing to users without adversely affecting the latency for users of the memory system. For example, erasing the user data opposed to simply erasing the cryptographic key may cause increased difficulty for a bad actor to access the user data, thereby enhancing data security. In some cases, using the normal refresh cycles to overwrite the user data may allow the memory system controller and the host system controller to perform other operations (e.g., access operations) at the memory system simultaneously with erasing user data, without adversely affect the performance of the memory system. In some cases, erasing the user data using the normal refresh cycles may enable greater bandwidth for the multitenancy controller to interact with other users. Therefore, implementing selectable memory system erase function as described herein may provide increased data security without adversely affecting performance of the memory system, among other advantages.

Figure 5:
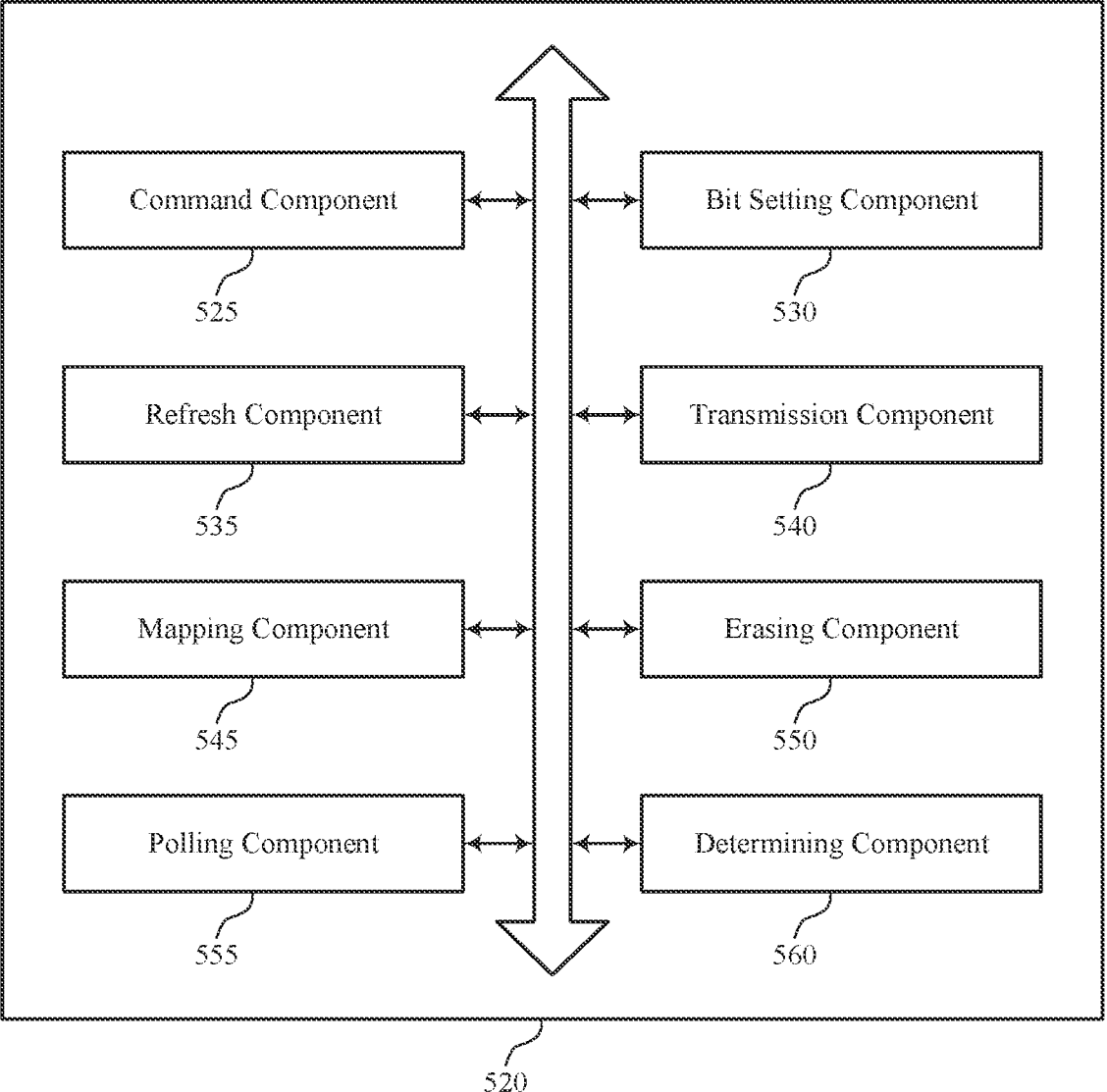
FIG. 5 shows a block diagram of a memory system that supports selectable memory system erase function in accordance with examples as disclosed herein.

FIG. 5 shows a block diagram 500 of a memory system 520 that supports selectable memory system erase function in accordance with examples as disclosed herein. The memory system 520 may be an example of aspects of a memory system as described with reference to FIGS. 1 through 4. The memory system 520, or various components thereof, may be an example of means for performing various aspects of selectable memory system erase function as described herein. For example, the memory system 520 may include a command component 525, a bit setting component 530, a refresh component 535, a transmission component 540, a mapping component 545, an erasing component 550, a polling component 555, a determining component 560, or any combination thereof. Each of these components may communicate, directly or indirectly, with one another (e.g., via one or more buses).

The command component 525 may be configured as or otherwise support a means for receiving, at a memory system, a command to refresh a first subset of a set of physical row addresses of the memory system. The bit setting component 530 may be configured as or otherwise support a means for setting one or more bits of a mode register corresponding to the first subset of the set of physical row addresses based at least in part on the com- mand, the one or more bits indicating to overwrite information stored in the first subset of the set of physical row addresses. The refresh component 535 may be configured as or otherwise support a means for performing a refresh operation that includes overwriting the first subset of the set of physical row addresses with new information and refreshing a second subset of the set of physical row addresses based at least in part on the one or more bits of the mode register. The transmission component 540 may be configured as or otherwise support a means for transmitting an indication that data associated with the first subset of the set of physical row addresses has been overwritten based at least in part on performing the refresh operation.

In some examples, to support setting the one or more bits, the bit setting component 530 may be configured as or otherwise support a means for setting one or more second bits of the mode register corresponding to the second subset of the set of physical row addresses based at least in part on the command, the one or more second bits of the mode register indicating to refresh the second subset of the set of physical row addresses.

In some examples, the bit setting component 530 may be configured as or otherwise support a means for setting the one or more bits of the mode register corresponding to the set of physical row addresses to indicate to refresh the set of physical row addresses based at least in part on performing the refresh operation. In some examples, the refresh component 535 may be configured as or otherwise support a means for performing a second refresh operation, by refreshing the set of physical row addresses including the first subset of the set of physical row addresses and the second subset of the set of physical row addresses, based at least in part on setting all of the one or more bits of the mode register.

In some examples, the mapping component 545 may be configured as or otherwise support a means for mapping a set of logical row addresses of the memory system associated with the command to the set of physical row addresses of the memory system.

In some examples, the erasing component 550 may be configured as or otherwise support a means for erasing the mode register based at least in part on performing the refresh operation, where erasing the mode register includes overwriting each bit of the mode register to a respective bit value. In some examples, the transmission component 540 may be configured as or otherwise support a means for transmitting an indication that the mode register has been erased based at least in part on overwriting each bit of the mode register.

In some examples, the polling component 555 may be configured as or otherwise support a means for polling the mode register to determine whether the refresh operation has been completed, where transmitting the indication is based at least in part on the polling.

In some examples, the determining component 560 may be configured as or otherwise support a means for determining a threshold duration since performing the refresh operation or setting the mode register, where the threshold duration is associated with a time interval for completing the refresh operation, where transmitting the indication is based at least in part on the determining.

In some examples, to support setting the one or more bits, the bit setting component 530 may be configured as or otherwise support a means for setting a first bit corresponding to a first physical row address of the first subset of the set of physical row addresses, the first bit indicating to commence clearing the first subset of the set of physical row addresses. In some examples, to support setting the one or more bits, the bit setting component 530 may be configured as or otherwise support a means for setting a last bit corresponding to a last physical row address of the first subset of the set of physical row addresses, the last bit indicating to terminate clearing the first subset of the set of physical row addresses.

In some examples, to support setting the one or more bits, the bit setting component 530 may be configured as or otherwise support a means for setting a first bit corresponding to a first physical row address of the first subset of the set of physical row addresses, the first bit indicating to commence overwriting the first subset of the set of physical row addresses. In some examples, to support setting the one or more bits, the bit setting component 530 may be configured as or otherwise support a means for setting a counter bit indicating to terminate overwriting the first subset of the set of physical row addresses based at least in part on a counter satisfying a counter value, where the counter value is associated with a quantity corresponding to the first subset of the set of physical row addresses. In some examples, to support setting the one or more bits, the bit setting component 530 may be configured as or otherwise support a means for setting the one or more bits of a mode register corresponding to the first subset of the set of physical row addresses, wherein the first subset of the set of physical row addresses is associated with one or more fixed regions of the memory system.

In some examples, the data associated with the first subset of the set of physical row addresses is associated with a user of the memory system.

In some examples, the command is a mode register set command.

In some examples, the memory system includes one or more DRAM devices. In some examples, the mode register is associated with a DRAM device of the one or more DRAM devices.

In some examples, the command component 525 may be configured as or otherwise support a means for receiving, at a controller coupled with a memory system, a first indication to overwrite information associated with a memory region of the memory system. In some examples, the command component 525 may be configured as or otherwise support a means for transmitting, to the memory system, a command to refresh a set of physical row addresses associated with the memory region of the memory system based at least in part on the first indication. In some examples, the refresh component 535 may be configured as or otherwise support a means for performing a refresh operation at the memory system, the refresh operation including overwriting the set of physical row addresses associated with the memory region of the memory system with new information based at least in part on the command. In some examples, the transmission component 540 may be configured as or otherwise support a means for transmitting, to the multitenancy controller, a second indication of the overwriting the set of physical row addresses associated with the memory region of the memory system with new information, based at least in part on the refresh operation.

In some examples, the bit setting component 530 may be configured as or otherwise support a means for storing one or more bits corresponding to the set of physical row addresses based at least in part on the command, the one or more bits indicating to refresh the set of physical row addresses.

In some examples, to support performing the refresh operation, the refresh component 535 may be configured as or otherwise support a means for refreshing a second set of physical row addresses associated with a second memory region of the memory system.

In some examples, the bit setting component 530 may be configured as or otherwise support a means for storing one or more bits corresponding to the second set of physical row addresses based at least in part on the command, the one or more bits indicating to refresh the second set of physical row addresses.

In some examples, the mapping component 545 may be configured as or otherwise support a means for mapping a set of logical row addresses of the memory system associated with the command to the set of physical row addresses.

In some examples, the determining component 560 may be configured as or otherwise support a means for determining a threshold duration since performing the refresh operation, where transmitting the second indication is based at least in part on the determining.

In some examples, to support overwriting the set of physical row addresses associated with the memory region, the erasing component 550 may be configured as or otherwise support a means for erasing the information, inversing the information, or randomizing the information, or any combination thereof.

In some examples, the memory region is associated with a user of a plurality of users of the memory system. In some examples, the memory region is one of a plurality of memory regions associated with the plurality of users.

In some examples, the information is associated with the user corresponding to the memory region.

In some examples, the memory system includes one or more DRAM devices. In some examples, the memory region is one of a plurality of memory regions associated with a DRAM device of the one or more DRAM devices.

FIG. 6 shows a flowchart illustrating a method 600 that supports selectable memory system erase function in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include receiving, at a memory system, a command to refresh a first subset of a set of physical row addresses of the memory system. The operations of 605 may be performed in accordance with examples as disclosed herein. In some examples, aspects of the operations of 605 may be performed by a command component 525 as described with reference to FIG. 5.

At 610, the method may include setting one or more bits of a mode register corresponding to the first subset of the set of physical row addresses based at least in part on the command, the one or more bits indicating to overwrite information stored in the first subset of the set of physical row addresses. The operations of 610 may be performed in accordance with examples as disclosed herein. In some examples, aspects of the operations of 610 may be performed by a bit setting component 530 as described with reference to FIG. 5.

At 615, the method may include performing a refresh operation that includes overwriting the first subset of the set of physical row addresses with new information and refreshing a second subset of the set of physical row addresses based at least in part on the one or more bits of the mode register. The operations of 615 may be performed in accordance with examples as disclosed herein. In some examples, aspects of the operations of 615 may be performed by a refresh component 535 as described with reference to FIG. 5.

At 620, the method may include transmitting an indication that data associated with the first subset of the set of physical row addresses has been overwritten based at least in part on performing the refresh operation. The operations of 620 may be performed in accordance with examples as disclosed herein. In some examples, aspects of the operations of 620 may be performed by a transmission component 540 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory system, a command to refresh a first subset of a set of physical row addresses of the memory system; setting one or more bits of a mode register corresponding to the first subset of the set of physical row addresses based at least in part on the command, the one or more bits indicating to overwrite information stored in the first subset of the set of physical row addresses; performing a refresh operation that includes overwriting the first subset of the set of physical row addresses with new information and refreshing a second subset of the set of physical row addresses based at least in part on the one or more bits of the mode register; and transmitting an indication that data associated with the first subset of the set of physical row addresses has been overwritten based at least in part on performing the refresh operation.

Aspect 2: The method, apparatus, or non-transitory computer-readable medium of aspect 1, where setting the one or more bits includes operations, features, circuitry, logic, means, or instructions, or any combination thereof for setting one or more second bits of the mode register corresponding to the second subset of the set of physical row addresses based at least in part on the command, the one or more second bits of the mode register indicating to refresh the second subset of the set of physical row addresses.

Aspect 3: The method, apparatus, or non-transitory computer-readable medium of any of aspects 1 through 2, further including operations, features, circuitry, logic, means, or instructions, or any combination thereof for setting the one or more bits of the mode register corresponding to the set of physical row addresses to indicate to refresh the set of physical row addresses based at least in part on performing the refresh operation and performing a second refresh operation, by refreshing the set of physical row addresses including the first subset of the set of physical row addresses and the second subset of the set of physical row addresses, based at least in part on setting all of the one or more bits of the mode register.

Aspect 4: The method, apparatus, or non-transitory computer-readable medium of any of aspects 1 through 3, further including operations, features, circuitry, logic, means, or instructions, or any combination thereof for mapping a set of logical row addresses of the memory system associated with the command to the set of physical row addresses of the memory system.

Aspect 5: The method, apparatus, or non-transitory computer-readable medium of any of aspects 1 through 4, further including operations, features, circuitry, logic, means, or instructions, or any combination thereof for erasing the mode register based at least in part on performing the refresh operation, where erasing the mode register includes overwriting each bit of the mode register to a respective bit value and transmitting an indication that the mode register has been erased based at least in part on overwriting each bit of the mode register.

Aspect 6: The method, apparatus, or non-transitory computer-readable medium of any of aspects 1 through 5, further including operations, features, circuitry, logic, means, or instructions, or any combination thereof for polling the mode register to determine whether the refresh operation has been completed, where transmitting the indication is based at least in part on the polling.

Aspect 7: The method, apparatus, or non-transitory computer-readable medium of any of aspects 1 through 6, further including operations, features, circuitry, logic, means, or instructions, or any combination thereof for determining a threshold duration since performing the refresh operation or setting the mode register, where the threshold duration is associated with a time interval for completing the refresh operation, where transmitting the indication is based at least in part on the determining.

Aspect 8: The method, apparatus, or non-transitory computer-readable medium of any of aspects 1 through 7, where setting the one or more bits includes operations, features, circuitry, logic, means, or instructions, or any combination thereof for setting a first bit corresponding to a first physical row address of the first subset of the set of physical row addresses, the first bit indicating to commence clearing the first subset of the set of physical row addresses and setting a last bit corresponding to a last physical row address of the first subset of the set of physical row addresses, the last bit indicating to terminate clearing the first subset of the set of physical row addresses.

Aspect 9: The method, apparatus, or non-transitory computer-readable medium of any of aspects 1 through 8, where setting the one or more bits includes operations, features, circuitry, logic, means, or instructions, or any combination thereof for setting a first bit corresponding to a first physical row address of the first subset of the set of physical row addresses, the first bit indicating to commence overwriting the first subset of the set of physical row addresses and setting a counter bit indicating to terminate overwriting the first subset of the set of physical row addresses based at least in part on a counter satisfying a counter value, where the counter value is associated with a quantity corresponding to the first subset of the set of physical row addresses.

Aspect 10: The method, apparatus, or non-transitory computer-readable medium of any of aspects 1 through 9, where setting the one or more bits includes operations, features, circuitry, logic, means, or instructions, or any combination thereof for setting the one or more bits of a mode register corresponding to the first subset of the set of physical row addresses, wherein the first subset of the set of physical row addresses is associated with one or more fixed regions of the memory system.

Aspect 11: The method, apparatus, or non-transitory computer-readable medium of any of aspects 1 through 10, where the data associated with the first subset of the set of physical row addresses is associated with a user of the memory system.

Aspect 12: The method, apparatus, or non-transitory computer-readable medium of any of aspects 1 through 10, where the command is a mode register set command.

Aspect 13: The method, apparatus, or non-transitory computer-readable medium of any of aspects 1 through 12, where the memory system includes one or more DRAM devices and the mode register is associated with a DRAM device of the one or more DRAM devices.

FIG. 7 shows a flowchart illustrating a method 700 that supports selectable memory system erase function in accordance with examples as disclosed herein. The operations of method 700 may be implemented by a memory system or its components as described herein. For example, the operations of method 700 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 705, the method may include receiving, at a controller coupled with a memory system, a first indication to overwrite information associated with a memory region of the memory system. The operations of 705 may be performed in accordance with examples as disclosed herein. In some examples, aspects of the operations of 705 may be performed by a command component 525 as described with reference to FIG. 5.

At 710, the method may include transmitting, to the memory system, a command to refresh a set of physical row addresses associated with the memory region of the memory system based at least in part on the first indication. The operations of 710 may be performed in accordance with examples as disclosed herein. In some examples, aspects of the operations of 710 may be performed by a command component 525 as described with reference to FIG. 5.

At 715, the method may include performing a refresh operation at the memory system, the refresh operation including overwriting the set of physical row addresses associated with the memory region of the memory system with new information based at least in part on the command. The operations of 715 may be performed in accordance with examples as disclosed herein. In some examples, aspects of the operations of 715 may be performed by a refresh component 535 as described with reference to FIG. 5.

At 720, the method may include transmitting, to the multitenancy controller, a second indication of the overwriting the set of physical row addresses associated with the memory region of the memory system with new information, based at least in part on the refresh operation. The operations of 720 may be performed in accordance with examples as disclosed herein. In some examples, aspects of the operations of 720 may be performed by a transmission component 540 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for receiving, at a controller coupled with a memory system, a first indication to overwrite information associated with a memory region of the memory system; transmitting, to the memory system, a command to refresh a set of physical row addresses associated with the memory region of the memory system based at least in part on the first indication; performing a refresh operation at the memory system, the refresh operation including overwriting the set of physical row addresses associated with the memory region of the memory system with new information based at least in part on the command; and transmitting, to the multitenancy controller, a second indication of the overwriting the set of physical row addresses associated with the memory region of the memory system with new information, based at least in part on the refresh operation.

Aspect 15: The method, apparatus, or non-transitory computer-readable medium of aspect 14, further including operations, features, circuitry, logic, means, or instructions, or any combination thereof for storing one or more bits corresponding to the set of physical row addresses based at least in part on the command, the one or more bits indicating to refresh the set of physical row addresses.

Aspect 16: The method, apparatus, or non-transitory computer-readable medium of any of aspects 14 through 15, where performing the refresh operation further includes operations, features, circuitry, logic, means, or instructions, or any combination thereof for refreshing a second set of physical row addresses associated with a second memory region of the memory system.

Aspect 17: The method, apparatus, or non-transitory computer-readable medium of aspect 16, further including operations, features, circuitry, logic, means, or instructions, or any combination thereof for storing one or more bits corresponding to the second set of physical row addresses based at least in part on the command, the one or more bits indicating to refresh the second set of physical row addresses.

Aspect 18: The method, apparatus, or non-transitory computer-readable medium of any of aspects 14 through 17, further including operations, features, circuitry, logic, means, or instructions, or any combination thereof for mapping a set of logical row addresses of the memory system associated with the command to the set of physical row addresses.

Aspect 19: The method, apparatus, or non-transitory computer-readable medium of any of aspects 14 through 18, further including operations, features, circuitry, logic, means, or instructions, or any combination thereof for determining a threshold duration since performing the refresh operation, where transmitting the second indication is based at least in part on the determining.

Aspect 20: The method, apparatus, or non-transitory computer-readable medium of any of aspects 14 through 19, where overwriting the set of physical row addresses associated with the memory region includes operations, features, circuitry, logic, means, or instructions, or any combination thereof for erasing the information, inversing the information, or randomizing the information, or any combination thereof.

Aspect 21: The method, apparatus, or non-transitory computer-readable medium of any of aspects 14 through 20, where the memory region is associated with a user of a plurality of users of the memory system and the memory region is one of a plurality of memory regions associated with the plurality of users.

Aspect 22: The method, apparatus, or non-transitory computer-readable medium of aspect 21, where the information is associated with the user corresponding to the memory region.

Aspect 23: The method, apparatus, or non-transitory computer-readable medium of any of aspects 14 through 22, where the memory system includes one or more DRAM devices and the memory region is one of a plurality of memory regions associated with a DRAM device of the one or more DRAM devices.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

receiving, at a memory system, a command for a first subset of a set of physical row addresses of the memory system;

setting one or more bits of a mode register corresponding to the first subset of the set of physical row addresses based at least in part on the command, the one or more bits indicating to overwrite information stored in the first subset of the set of physical row addresses;

performing a first operation that comprises:

overwriting the first subset of the set of physical row addresses with new information; and refreshing a second subset of the set of physical row addresses based at least in part on the one or more bits of the mode register; and transmitting an indication that data associated with the first subset of the set of physical row addresses has been overwritten based at least in part on performing the first operation.

2. The method of claim 1, wherein setting the one or more bits comprises:

setting one or more second bits of the mode register corresponding to the second subset of the set of physical row addresses based at least in part on the command, the one or more second bits of the mode register indicating to refresh the second subset of the set of physical row addresses.

3. The method of claim 1, further comprising:

setting the one or more bits of the mode register corresponding to the set of physical row addresses to indicate to refresh the set of physical row addresses based at least in part on performing the first operation; and performing a second operation, by refreshing the set of physical row addresses including the first subset of the set of physical row addresses and the second subset of the set of physical row addresses, based at least in part on setting all of the one or more bits of the mode register.

4. The method of claim 1, further comprising:

mapping a set of logical row addresses of the memory system associated with the command to the set of physical row addresses of the memory system.

5. The method of claim 1, further comprising:

erasing the mode register based at least in part on performing the first operation, wherein erasing the mode register comprises overwriting each bit of the mode register to a respective bit value; and transmitting an indication that the mode register has been erased based at least in part on overwriting each bit of the mode register.

6. The method of claim 1, further comprising:

polling the mode register to determine whether the first operation has been completed, wherein transmitting the indication is based at least in part on the polling.

7. The method of claim 1, further comprising:

determining a threshold duration since performing the first operation or setting the mode register, wherein the threshold duration is associated with a time interval for completing the first operation, wherein transmitting the indication is based at least in part on the determining.

8. The method of claim 1, wherein setting the one or more bits comprises:

setting a first bit corresponding to a first physical row address of the first subset of the set of physical row addresses, the first bit indicating to commence clearing the first subset of the set of physical row addresses; and setting a last bit corresponding to a last physical row address of the first subset of the set of physical row addresses, the last bit indicating to terminate clearing the first subset of the set of physical row addresses.

9. The method of claim 1, wherein setting the one or more bits comprises:

setting a first bit corresponding to a first physical row address of the first subset of the set of physical row addresses, the first bit indicating to commence overwriting the first subset of the set of physical row addresses; and setting a counter bit indicating to terminate overwriting the first subset of the set of physical row addresses based at least in part on a counter satisfying a counter value, wherein the counter value is associated with a quantity corresponding to the first subset of the set of physical row addresses.

10. The method of claim 1, wherein setting the one or more bits comprises:

setting the one or more bits of the mode register corresponding to the first subset of the set of physical row addresses, wherein the first subset of the set of physical row addresses is associated with one or more fixed regions of the memory system.

11. The method of claim 1, wherein the data associated with the first subset of the set of physical row addresses is associated with a user of the memory system.

12. The method of claim 1, wherein the command is a mode register set command.

13. The method of claim 1, wherein:

the memory system comprises one or more dynamic random access memory (DRAM) devices, and the mode register is associated with a DRAM device of the one or more DRAM devices.

14. A method, comprising:

receiving, at a controller coupled with a memory system, a first indication to overwrite information associated with a memory region of the memory system;

transmitting, to the memory system, a command for a set of physical row addresses associated with the memory region of the memory system based at least in part on the first indication;

performing a first operation at the memory system, the first operation comprising:

overwriting the set of physical row addresses associated with the memory region of the memory system with new information based at least in part on the command; and transmitting, to the controller, a second indication of the overwriting the set of physical row addresses associated with the memory region of the memory system with new information, based at least in part on the first operation.

15. The method of claim 14, further comprising:

storing one or more bits corresponding to the set of physical row addresses based at least in part on the command, the one or more bits indicating to refresh the set of physical row addresses.

16. The method of claim 14, wherein performing the first operation further comprises:

refreshing a second set of physical row addresses associated with a second memory region of the memory system.

17. The method of claim 16, further comprising:

storing one or more bits corresponding to the second set of physical row addresses based at least in part on the command, the one or more bits indicating to refresh the second set of physical row addresses.

18. The method of claim 14, further comprising:

mapping a set of logical row addresses of the memory system associated with the command to the set of physical row addresses.

19. The method of claim 14, further comprising:

determining a threshold duration since performing the first operation, wherein transmitting the second indication is based at least in part on the determining.

20. An apparatus, comprising:

a memory system comprising one or more memory devices; and a controller associated with the memory system, wherein the controller is configured to cause the memory system to:

receive a command for a first subset of a set of physical row addresses of the memory system;

set one or more bits of a mode register corresponding to the first subset of the set of physical row addresses based at least in part on the command, the one or more bits indicating to overwrite information stored in the first subset of the set of physical row addresses;

perform a first operation that comprises:

overwriting the first subset of the set of physical row addresses with new information; and refreshing a second subset of the set of physical row addresses based at least in part on the one or more bits of the mode register; and transmit an indication that data associated with the first subset of the set of physical row addresses has been overwritten based at least in part on performing the first operation.

* * * * *